United States Patent [19]
Shield et al.

[11] Patent Number: 5,736,777
[45] Date of Patent: Apr. 7, 1998

[54] METHOD AND APPARATUS FOR FAST SELF-DESTRUCTION OF A CMOS INTEGRATED CIRCUIT

[75] Inventors: David J. Shield, El Dorado Hills, Calif.; Derek L. Davis, Phoenix, Ariz.

[73] Assignee: Intel Corporation, Santa Clara, Calif.

[21] Appl. No.: 581,436

[22] Filed: Dec. 29, 1995

[51] Int. Cl.[6] .................................................. H01L 29/00
[52] U.S. Cl. ......................... 257/529; 257/379; 438/215; 438/467
[58] Field of Search .................... 257/529, 379, 257/665; 438/215, 467

[56] References Cited

U.S. PATENT DOCUMENTS

| | | | |
|---|---|---|---|
| 3,882,323 | 5/1975 | Smolker | 307/202 A |
| 4,447,823 | 5/1984 | Maeguchi et al. | 257/347 |
| 4,851,894 | 7/1989 | de Ferron et al. | 257/529 |
| 5,003,371 | 3/1991 | Tailliet et al. | 257/529 |
| 5,552,338 | 9/1996 | Kang | 257/529 |

Primary Examiner—J. Carroll
Attorney, Agent, or Firm—Blakely, Sokoloff, Taylor & Zafman

[57] ABSTRACT

A method and apparatus for fast electronic self-destruction of a CMOS integrated circuit. The present invention electrically destroys devices containing semiconductor components, securing the components from inspection by detecting the initiation of an attempt to inspect the component and, responsive thereto, electrically destroying the component. In some embodiments of the present invention, a switcheable pad having a destruct state and an operating state is connected to a well or to the substrate of the semiconductor device. When in destruct state, the switcheable pad drives the voltage of the well or substrate to a voltage that induces latch-up of the semiconductor device, allowing very large currents to flow through active or passive elements fabricated on the surface of the semiconductor device. In some embodiments, a fusible link having an open state and a closed state connects the switcheable pad to one power supply, so that when the switcheable pad is switched to the destruct state, the fusible link opens, thereby redirecting current through the parasitic PNPN junction of the semiconductor device, thus inducing large latch-up currents through the cell's fusible link and causing it to open, thus destroying the ability of that logic element to function or process data.

15 Claims, 8 Drawing Sheets

METHOD AND APPARATUS FOR FAST SELF-DESTRUCTION OF A CMOS INTEGRATED CIRCUIT

FIELD OF THE INVENTION

The present invention relates to the field of integrated circuits; more particularly, the present invention relates to the field of secure integrated circuit technology.

BACKGROUND OF THE INVENTION

Inspection of electronic devices has serious repercussions for the defense industry. A foreign enemy who can inspect captured electronic devices containing classified information is a potential threat to national security. Protecting data and mask-work security, consequently, has become an important concern. This is a concern, for example, when a pilot ejects from an aircraft under conditions in which foreign enemies might recover all or part of the aircraft's electronic systems. Despite partial destruction of some systems, electronic data or circuitry itself may retain vital classified or defense-related information whose discovery by enemies of the United States may significantly damage national security. It would therefore be desirable to provide pilots with a button or switch, or aircraft with an automatic system, that could completely or significantly destroy electronic data and circuitry when activated.

Theft of corporate business and technological proprietary information is also problem in modern society. In practically every area of business, unscrupulous competitors and contractors, and even outside investors, have an incentive to steal proprietary information, to learn corporate business strategies or to gain unfair advantage in business negotiations. Data is not the only intellectual property stolen by technologically sophisticated thieves; the electronic circuits within an integrated circuit may themselves be the target of industrial espionage. No industry has more to lose from the misappropriation of proprietary information than the software and electronics industries, in which reverse-engineering a silicon chip or copying data from a database may result in vast financial losses. Other industries, also, have been the targets of such technological espionage. The misappropriation of personal financial and medical information stored electronically concerns hospitals, banks and other financial institutions, employers and insurers as well as private individuals. Compounding the problem is the fact that many items of personal information, such as passport number, social security number, driver's license number, and mother's maiden name, are used as passwords to access other databases. In other words, once one security device is breached, others are made easier to breach. Learning even some of a potential victim's personal information can further a criminal's goal of transferring or withdrawing funds from the victim's account, ordering unauthorized credit cards, and in some cases stealing whole identities.

Therefore, it would be desirable to provide computers, bank teller machines, database processors, and other electronic and computer systems with a self-destruct system that significantly damages or destroys electronics upon the occurrence of a predetermined event.

The predetermined event can be any of a variety of events that indicate undesired inspection or misuse of a system or device. For example, repeated failed attempts to access data, the breach of a physical enclosure surrounding the electronics, or the disconnection of a power supply may indicate an attempt to gain unauthorized access to an electronic device or system. Alternatively, a user may decide intentionally to destroy the electronics. Therefore it is desirable that a destruction system be flexible in the types of events to which the system responds.

Attempts at data security have largely relied on two methods: encryption and encasing. Data encryption relies on a coding scheme that is known only to the rightful owners of the encoded information. Data encryption is of limited value, though, when the coding scheme is known by a large number of persons, including former employees, or when a coding scheme is not sufficiently complex. Furthermore, encryption offers no way to protect the circuits themselves from inspection by competitors.

Encasing offers some protection for electronic circuits by surrounding the circuits with a solid material that is difficult to penetrate. Occasionally, two layers surround the device, an inner layer that reacts violently, corrosively or exothermally with the atmosphere, and an outer layer encasing the inner layer and protects the environment from the effects of the reactive layer. While these methods can be effective against some less sophisticated thieves, others who are truly determined to examine a DRAM, SRAM, or EPROM, for example, have learned to cut or burn through the outer, protective layer. Solid layers can be cut or burned away, revealing terminals and, in some cases, the actual circuit topology on the chip. When done in darkened environments, such invasive procedures may not cause complete erasure of EPROMs, and when examined in certain controlled, ambient atmospheric conditions, or when brought to certain temperatures, chemical security means may not be effective, either.

Additionally, because terminals still must extend from the encasing material to enable use of the chip, one who has obtained the chip wrongfully often can simply transfer the information stored thereon onto another data storage device and read it there.

Because encasing and encryption may be defeated by unauthorized persons wrongfully in possession of an electronic device, it is desirable for a stolen memory or circuit to destroy all confidential circuits or data upon detecting a breach of security. Due to these and other problems associated with encryption and encasing, it is desirable for a destruct system to be triggered electrically or electronically, rather than physically or chemically. Some electrical destruct systems are well known. Destruction may be accomplished, as is well known in the art, by overpowering all the memory cells or circuits in a system with large voltage and current sources. Many systems do in fact have large power supplies connected to all the circuits therein, and connect the large power supply to all the circuits when a breach in security is detected. Such methods often fail, however. First, because the power needed to damage all the circuits in a system is so large, the power supply typically cannot handle the demand and the system is not really damaged. Second, because of the power demands, the power supplies often are too large for inclusion within the system, and so are located externally, where they may simply be disconnected from the circuits they are programmed to destroy, preventing the destruction of the circuits when a breach in security is detected. Third, the large power supplies generally do not have sufficient safeguards against accidental erasure. Other methods in the prior art for protecting electronics have similar short comings. Finally, the supply power required to destroy an entire array of chips may not be safe for the human operators.

Therefore, it is desirable to prevent as much of the unauthorized inspection of confidential electronic devices as is possible. It is desirable to develop a way to protect a memory or a circuit containing confidential information, the protection using low power, occupying a small space within the circuit, and be difficult to defeat. It is also, of course, desirable that any electronic security measures include fail-safes against accidental destruction or erasure of the device.

Figure 1:
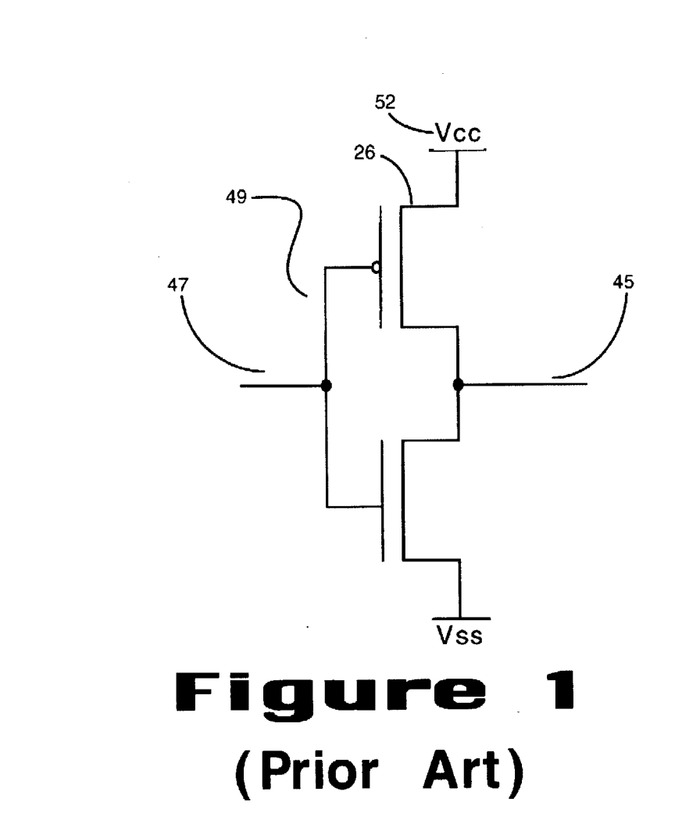
FIG. 1 shows a typical CMOS prior art inverter using transistors to invert an input signal and produce an output signal.

FIG. 1 illustrates a typical inverter using CMOS transistors to invert an input signal and produce an output signal. The operation of transistors in a typical inverter circuit is well understood in the art. A P-type silicon substrate 10 contains an N-well 22 in which a PNP transistor 49 is fabricated. A PNP transistor 42 is also formed in the P-substrate 10 as a lateral device comprising regions. The gates of the two transistors are connected by an input or data line 47, and a source terminal 24 and 43 of each of the transistors are connected by an output or second data line 45. The PNP transistor 49 is held in reverse bias with respect to the N-well 22 by a heavily-doped N-type floating node 32 that is maintained at a high (positive) voltage, and the PNP transistor 42 is held in reverse bias with respect to the P-substrate 10 by a heavily-doped floating node within the P-substrate 10. The reverse bias produced by the floating nodes prevents destructive latch-up by ensuring that no current flows between the N-well and the P-terminals 26 and 24 of the PNP transistor 49, nor between then P-substrate 10 and the PNP transistor 42. The N-well 22 is also reverse biased with respect to the P-substrate 10. Due to the ubiguity of such inverters and other integrated circuit devices, it would be desirable for an entire system to be destructible by triggering a relatively small number of destructible components, such as the devices shown in these figures.

SUMMARY OF THE INVENTION

A method and apparatus for fast self-destruction of a CMOS integrated circuit is described. The present invention electrically destroys devices containing semiconductor components, securing the components from inspection by detecting the initiation of an attempt to inspect the component and, responsive thereto, electrically destroying the component. In some embodiments of the present invention, a switcheable pad having a destruct state and an operating state is connected to a well or to the substrate of the semiconductor device. When in destruct state, the switcheable pad drives the voltage of the well or substrate to a voltage that induces latch-up of the semiconductor device, allowing very large currents to flow through active or passive elements fabricated on the surface of the semiconductor device. In some embodiments, a fusible link having an open state and a closed state connects the switcheable pad to one power supply, so that when the switcheable pad is switched to the destruct state, the fusible link redirects current through the semiconductor device.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A method and apparatus for fast self-destruction of a CMOS integrated circuit is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 2:
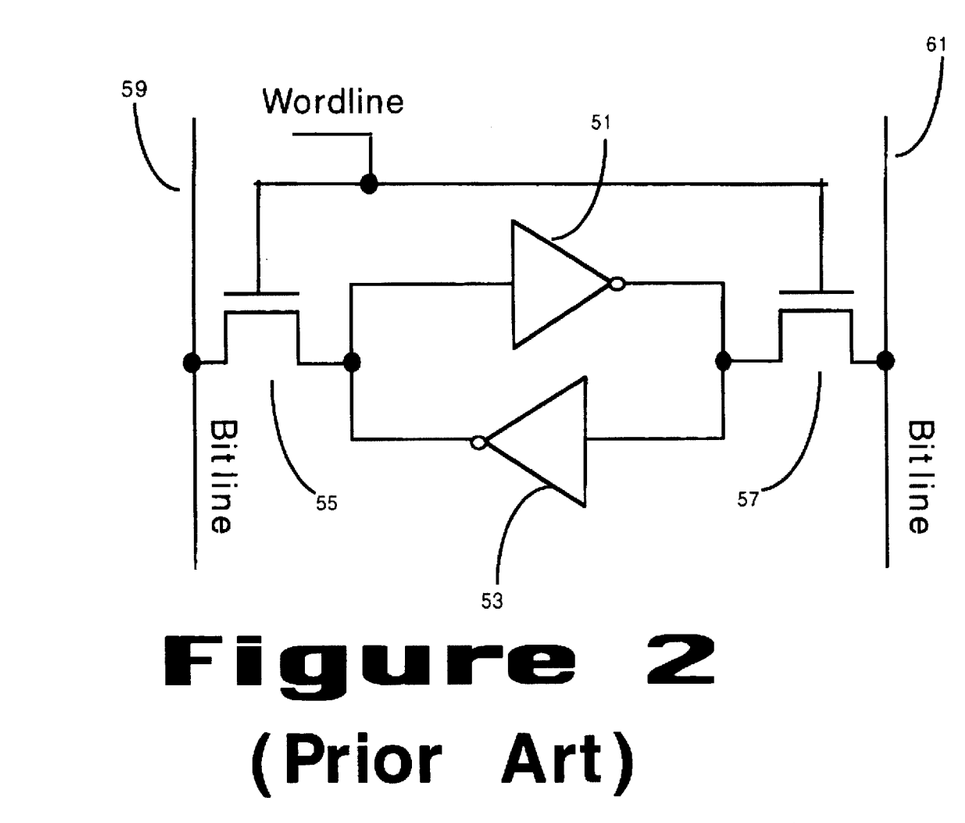
FIG. 2 shows a prior art memory cell using a pair of inverters.

FIG. 2 shows a pair of inverters 51 and 53 reverse-coupled, the inputs and outputs of the inverters being gated by external transistors 55 and 57. When the external transistors 55 and 57 are in cutoff, data is retained in the inverters 51 and 53. Conversely, when the external transistors are in saturation, the inverter 51 and 53 communicate the data to bit lines 59 and 61, or receive data from bit lines 59 and 61.

Figure 3:
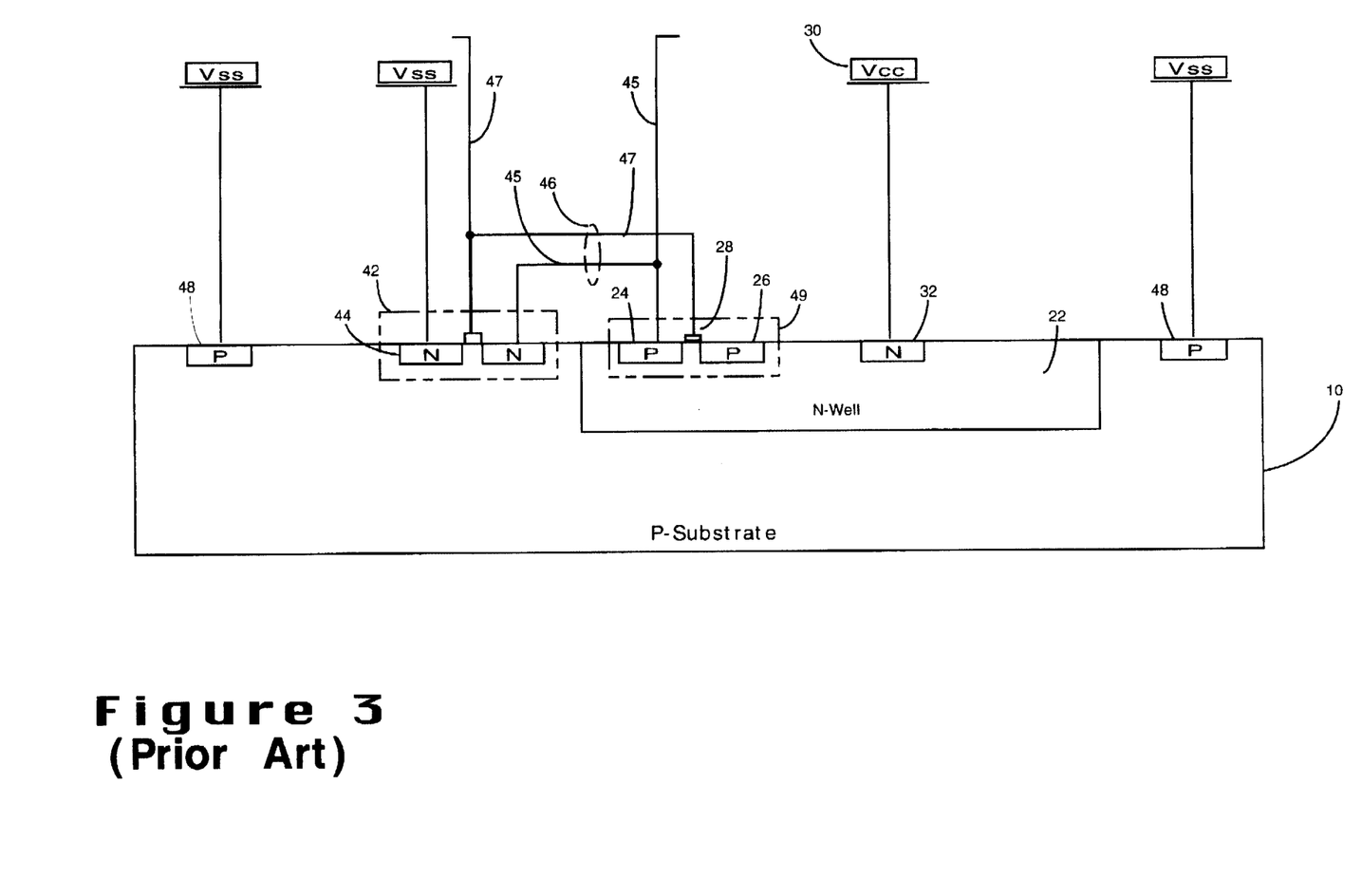
FIG. 3 shows a prior art implementation of an inverter, fabricated on a silicon substrate.

FIG. 3 further illustrates one possible implementation of a prior art inverter as shown in FIGS. 1 and 2. The circuit of FIG. 3 may be fabricated on a P substrate 10 as an N-well device.

Figure 4:
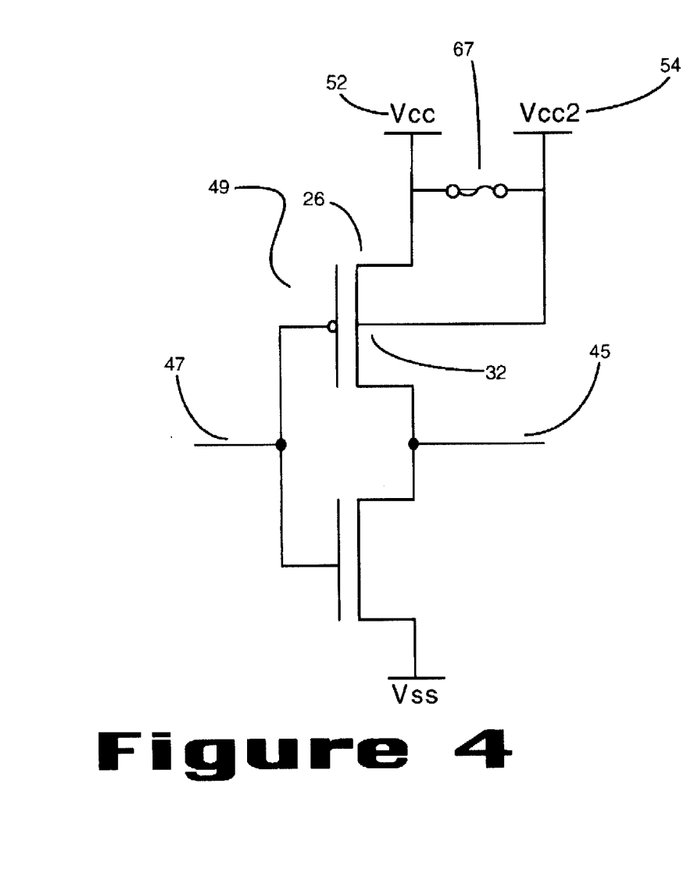
FIG. 4 shows an inverter according to a first embodiment of the present invention.

FIG. 4 shows an inverter circuit according to one embodiment of the present invention. The inverter is similar to the inverter of FIG. 1; however, a switcheable pad 54 has been coupled to the N-well 32 of the PNP transistor 49. The switcheable pad 54 is a terminal that may be maintained in either of two states: a high-impedance state, allowing normal operation of the circuits to which the switcheable pad 54 is coupled, and a destruct state, in which the circuit coupled to the switcheable pad 54 is destroyed. Although not shown, an external event-driven destruct command system coupled to the switcheable pad 54 transitions the switcheable pad 54 from the high-impedance state to the destruct state upon the occurrence of a predetermined event, or set or sequence of events. Furthermore, a fusible link 67 is coupled between the main power supply 52 and the first transistor 49. During normal operation, i.e. when the high-impedance state, the switcheable pad 54 is an open-circuit, disconnected from any particular voltage and thus carries extremely low or no current. The current flowing from the main power supply 52 through the fusible link 67 to the N-well 32 of the transistor 49 ensures a positive voltage in the N-well 22. This positive voltage provides a reverse bias between the N-well 22 and the transistor 49. The switcheable pad 54 can be coupled to any well, either the P-well, N-well, or both wells in a dual well device.

It will be readily apparent to one of ordinary skill in the art upon reference to the present description of the present invention that the fusible link 67 may be omitted, and the switcheable pad 54 independently maintained at a high positive voltage sufficient to prevent parasitic latch-up in the integrated circuit during normal operation, the switcheable pad 54 being driven to a sufficiently low voltage when destruction of the integrated circuit is desired.

Figure 5:
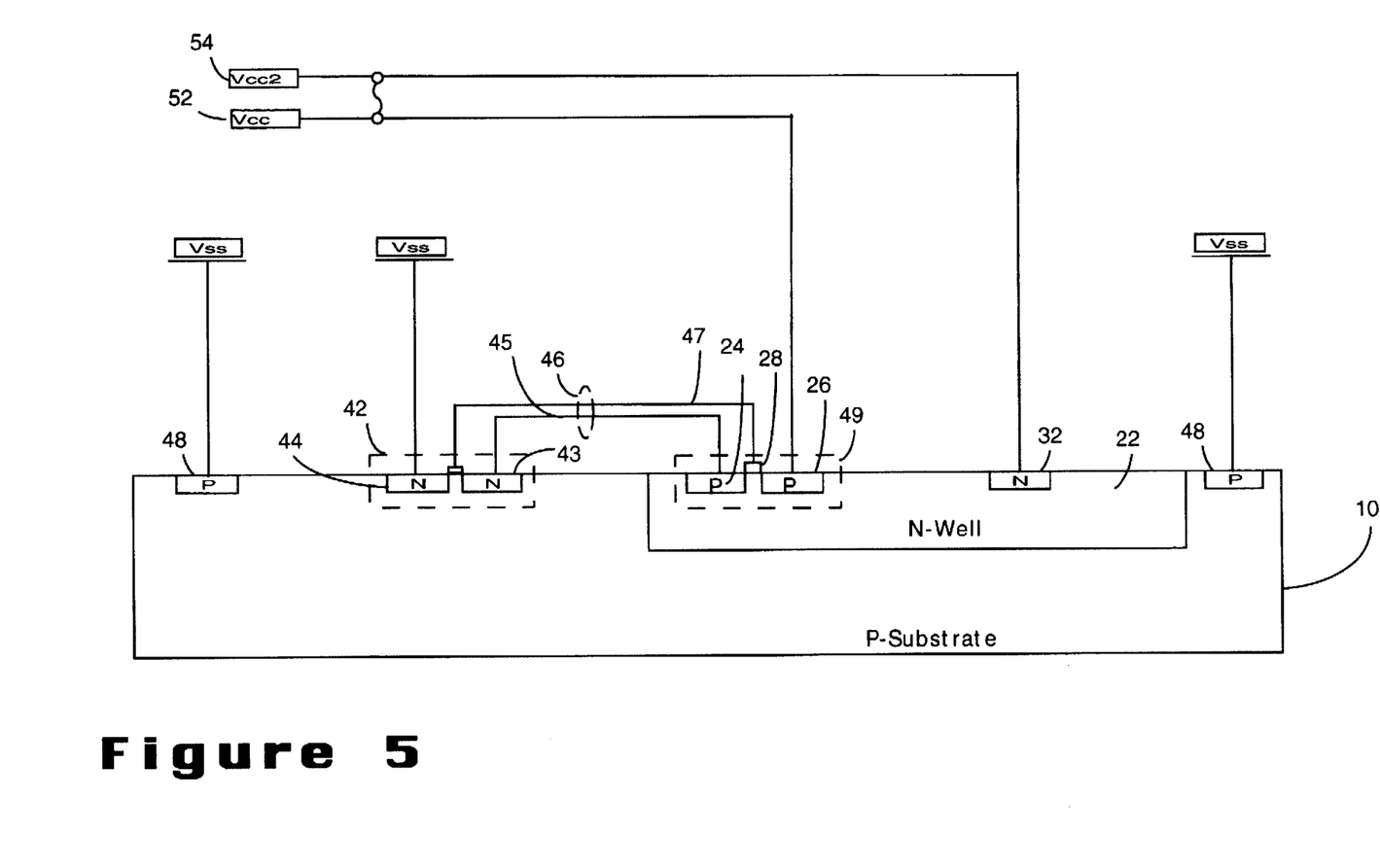
FIG. 5 is a cross-sectional side view of the inverter circuit according to the first embodiment of the present invention, illustrating a normal mode of operation.

Referring now to FIG. 5, one embodiment of the present invention, when the switcheable pad 54 is in the high-impedance state, is presented in greater detail. During normal operation of the embodiment illustrated in FIG. 5, the first power supply 52 provides a positive voltage, across a connecting fusible link 67, maintaining the N-well 22 at the upper rail voltage $V_{cc}$. Latch-up is prevented, as the N-well 22 is in reverse bias with respect to the P-type nodes of the PNP transistor 49, and the N-type terminals of the PMOS transistor 42 is in reverse bias with respect to the P-substrate 10. The switcheable pad 54 is maintained as an open circuit, and thus does not alter the voltage applied to the N-well 22. As stated with respect to FIG. 4, the positive voltage ensures that, during normal operation, there is a reverse bias between the transistor 49 and the N-well 22.

During normal operation, the switcheable pad 54 is an open circuit, and is maintained at the positive voltage of the first power supply 52 across the fusible link 67, as is the N-well 22. Bringing switcheable pad 54 to ground potential, however, results in the complete destruction of that logic element, and thus effectively the integrated circuit. As stated above, the transition of the switcheable pad 54 from the high-impedance state to ground potential is accomplished by an external system or device selected by the system implementer and responsive to an event or a set of sequence of events. The external system or device may comprise a register, a clock, a button or switch, or other method or apparatus for transitioning the voltage of the switcheable pad 54. After the switcheable pad 54 transitions to the destruct state, the N-well 22 of the circuit is also brought to substantially the same voltage as the switcheable pad 54, or to a voltage that, with respect to the voltage applied by the first power supply 52, allows a parasitic forward bias to develop between the P-terminal 26 of the first transistor 49 and the N-well 22. The operation of the circuit when the switcheable pad 54 is in the destruct state is described below with reference to FIG. 7.

Figure 7:
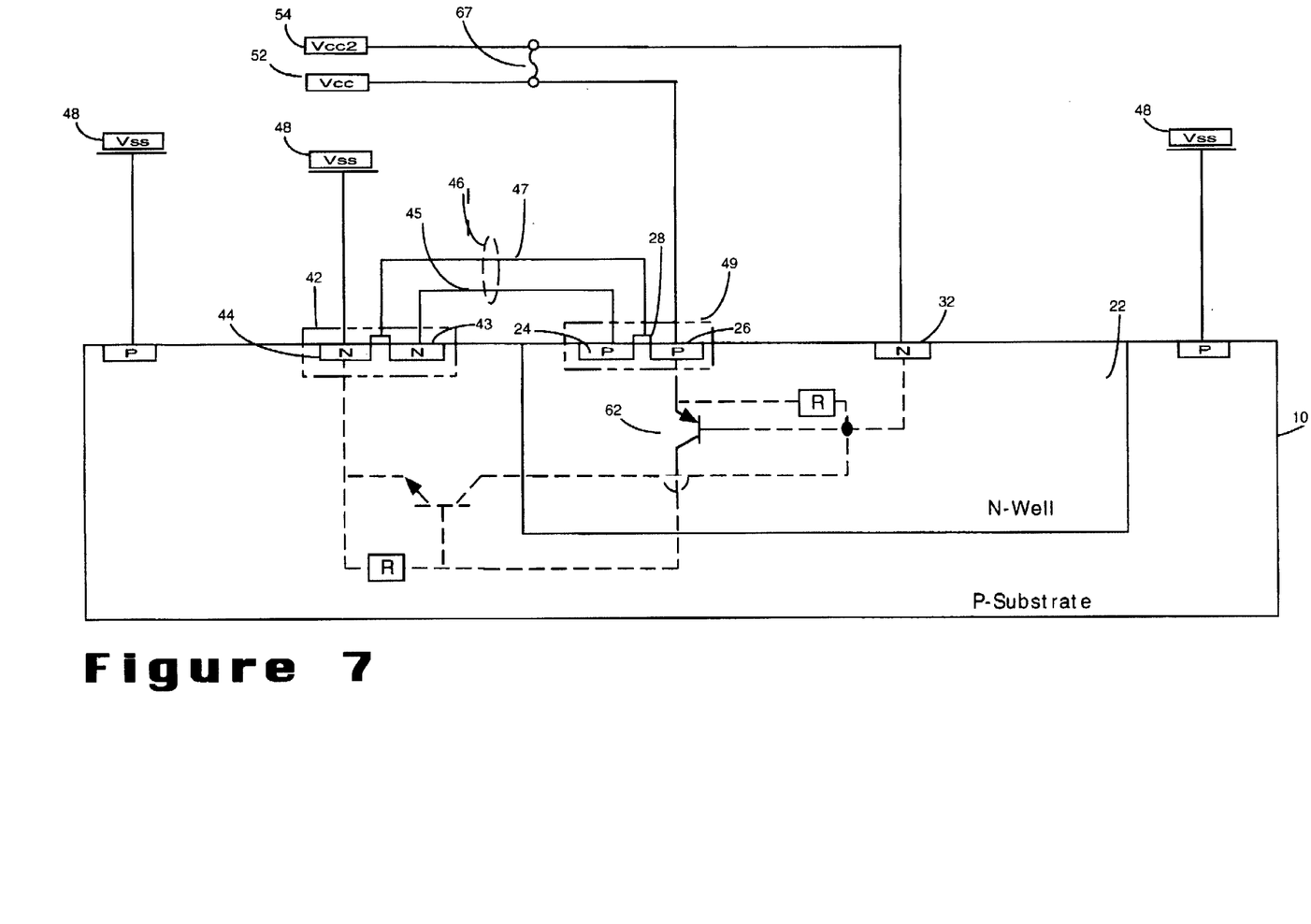
FIG. 7 is a cross-sectional side view of the inverter circuit as shown in FIG. 5, showing current paths through the circuit in the destruct mode of operation.

Referring now to FIG. 7, the first embodiment of the present invention, when the switcheable pad 54 is in the destruct state, is presented in greater detail. The catastrophic effect of the forward bias between the N-well 22 and the PNP transistor 49 is shown. When the switcheable pad 54 is grounded or brought to the lower rail voltage, while the first power supply continues to apply a positive voltage to the transistor terminal 26 residing in the N-well 32, a forward-biased junction 62 is formed between the first transistor 26 and the N-well 32. The forward bias is created when the switcheable pad 54 is brought to ground potential. Very large currents are generated by the first power supply 52 across the fusible link 67. The fusible link 67 is blown by the large current, and the N-well 22 is brought to a low voltage. It will also be understood that, although reference is made to ground potential, any voltage source or circuit able to drain sufficient current from the first power supply 52 through the circuit after the fusible link 67 is broken will allow destruction of the circuit. The low voltage at the N-well 22 provides a forward bias across the junction between the P-terminal 26 of the PMOS transistor 49 and the N-well 22. Very large currents flow from the first power supply 52 through the PMOS transistor 49, across the transistor-well junction and to the N-well 22, to the switcheable pad 54.

The large currents generated are shown in FIG. 7, and are represented by dotted lines between the N-well 22 and the terminals of the first and second transistors 42 and 49. Current from the first power supply 52 passes through the P-terminal 26 of the first transistor 49 into the N-well 22. The N-well 22 acts as a base or gate of a parasitic transistor comprised of the P-terminal 26, the N-well 22, and the P-substrate 10, and represented generally as a transistor 62. It will be understood that transistor 62 is not a discrete element in the circuit, but rather represents the effect of forward-biasing the junction between the P-terminal 26 and the N-well 22.

Also, the reverse bias barrier between the P-substrate 10 and the N-well 22 is reduced significantly. Providing a small-impedance path from the main power supply 52 to ground, the junction between the N-well 22 and the P-substrate 10 forces large current into the P-substrate 10 from the main power supply 52. The current crossing the barrier between the P-substrate 10 and the N-well 22 is shown in FIG. 7 as dotted lines. The intentionally-created forward-biased parasitic transistor draws several milliamperes of current through the transistor 26, whereas a reverse bias between the N-well 32 and the transistor 26 allows only microamperes to flow.

Figure 8:
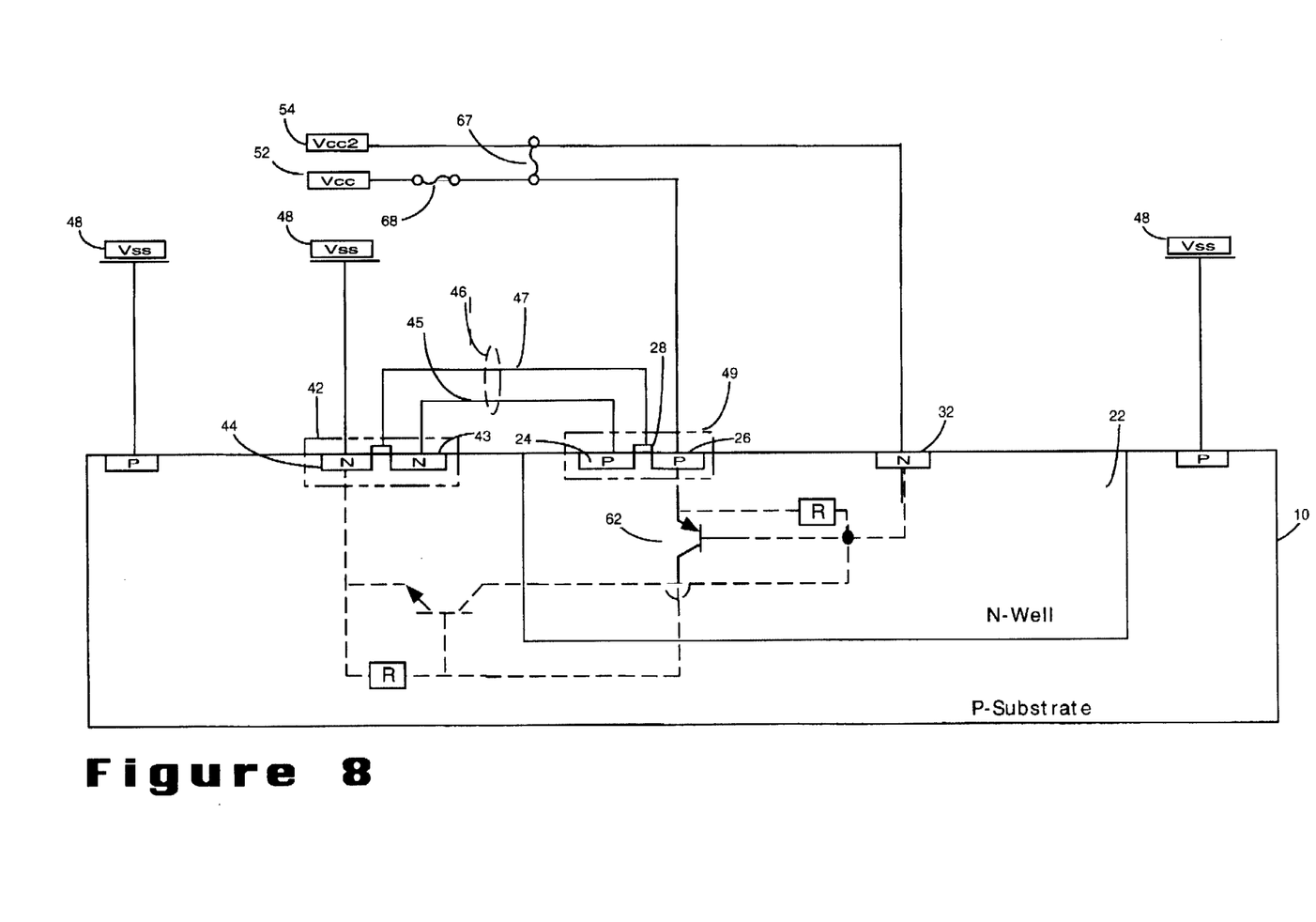
FIG. 8 is a cross-sectional side view of the inverter circuit as shown in FIG. 6, showing current paths through the circuit in the destruct mode of operation.

As shown in FIG. 8, due to the large amounts of current flowing through the intentionally-triggered latch-up, the fusible link 68 opens, destroying the operation of that logic element. A single destructible element may be sufficient to disable the entire integrated circuit. However, by implementing multiple destructible logic elements in strategically selected logic paths, the degree of destruction is increased, and the likelihood of repairing the integrated circuit in order to restore its function is dramatically reduced. The heat generated by the resulting current is sufficient to destroy any information stored in the silicon element or chip.

Figure 6:
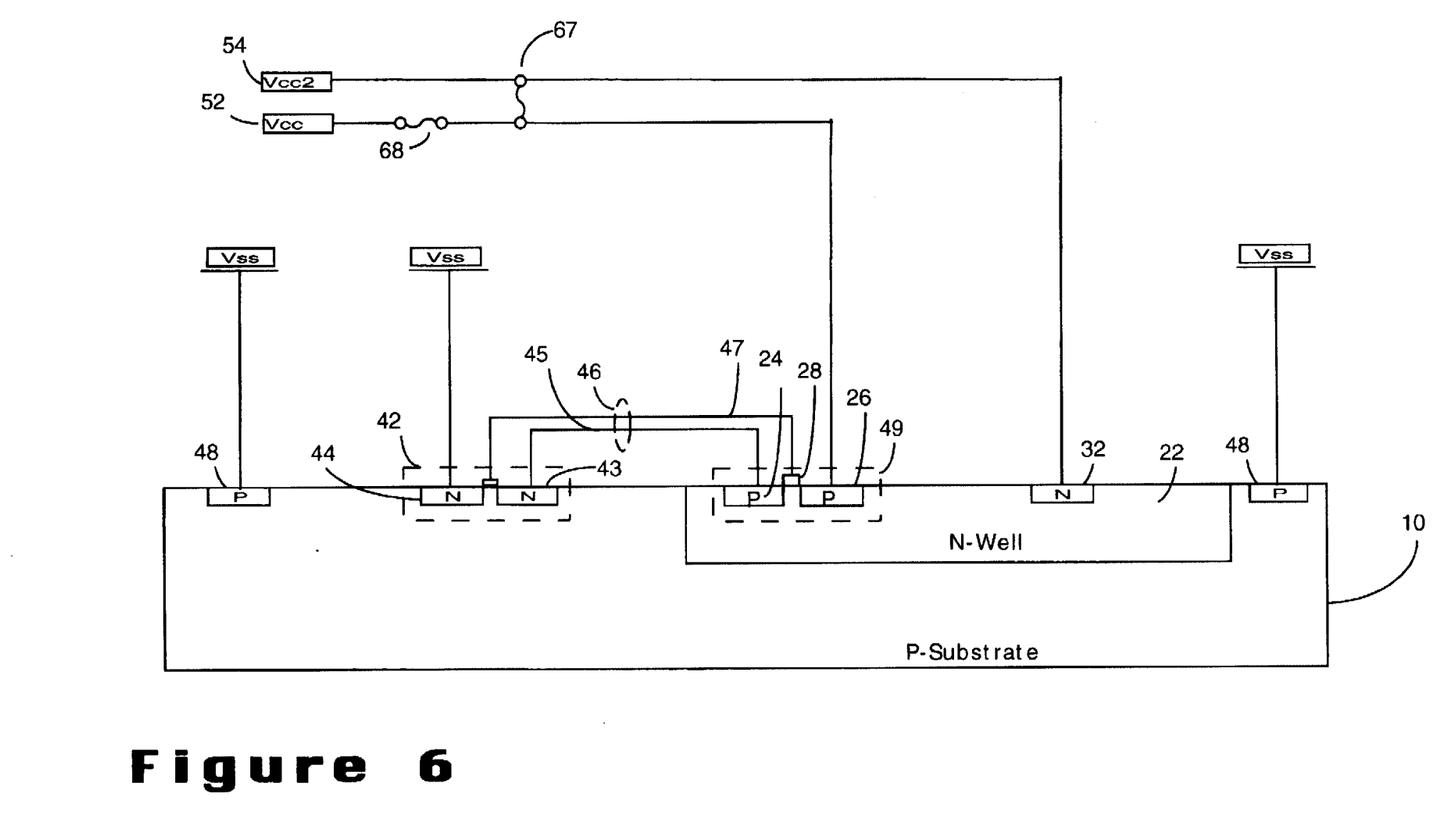
FIG. 6 is a cross-sectional side view of the inverter circuit according to a second embodiment, having an additional fuse in the current path.

FIGS. 6 and 8 show an alternate embodiment in which the switcheable pad 54 is in a high-impedance state and a destruct state, respectively. The operation of the embodiment shown in FIG. 6 operates as the embodiment of FIG. 5 so long as the current through the second fusible link 68 is sufficiently low that the second fusible link 68 is not broken. Then the switcheable pad 54 is transitioned into the destruct state, however, large current flows through the circuit as described above with reference to FIG. 7, and as shown in FIG. 8. Finally, after current through the circuit has destroyed the circuit and any data stored therein, the second fusible link 68 is broken. Breaking the second fusible link 68 permanently prevents reconnection of the circuit. It will be readily apparent that the second fusible link 68 may appear anywhere in the normal operating mode current path, including between the switcheable pad 54 and the N-well 22.

As shown in FIGS. 6 and 8, the addition of a second fusible link 68 between the first power supply 52 and the P-terminal of the PNP transistor 49 is blown when the current through fuse 68 exceeds a predetermined threshold, resulting in an open circuit. The destruction of fuse 68 permanently disables reconnection of the transistor 49 to an external power supply Vcc, such as the first power supply 52. However, the second fusible link 68 does not blow until the parasitic SCR latch-up has occurred, destroying the logic element, and thus the integrated circuit.

It will be recognized by one of ordinary skill in the art that the present invention can be fabricated using N-well, P-well, or dual-well devices, or by other technologies known in the art.

Figure 9:
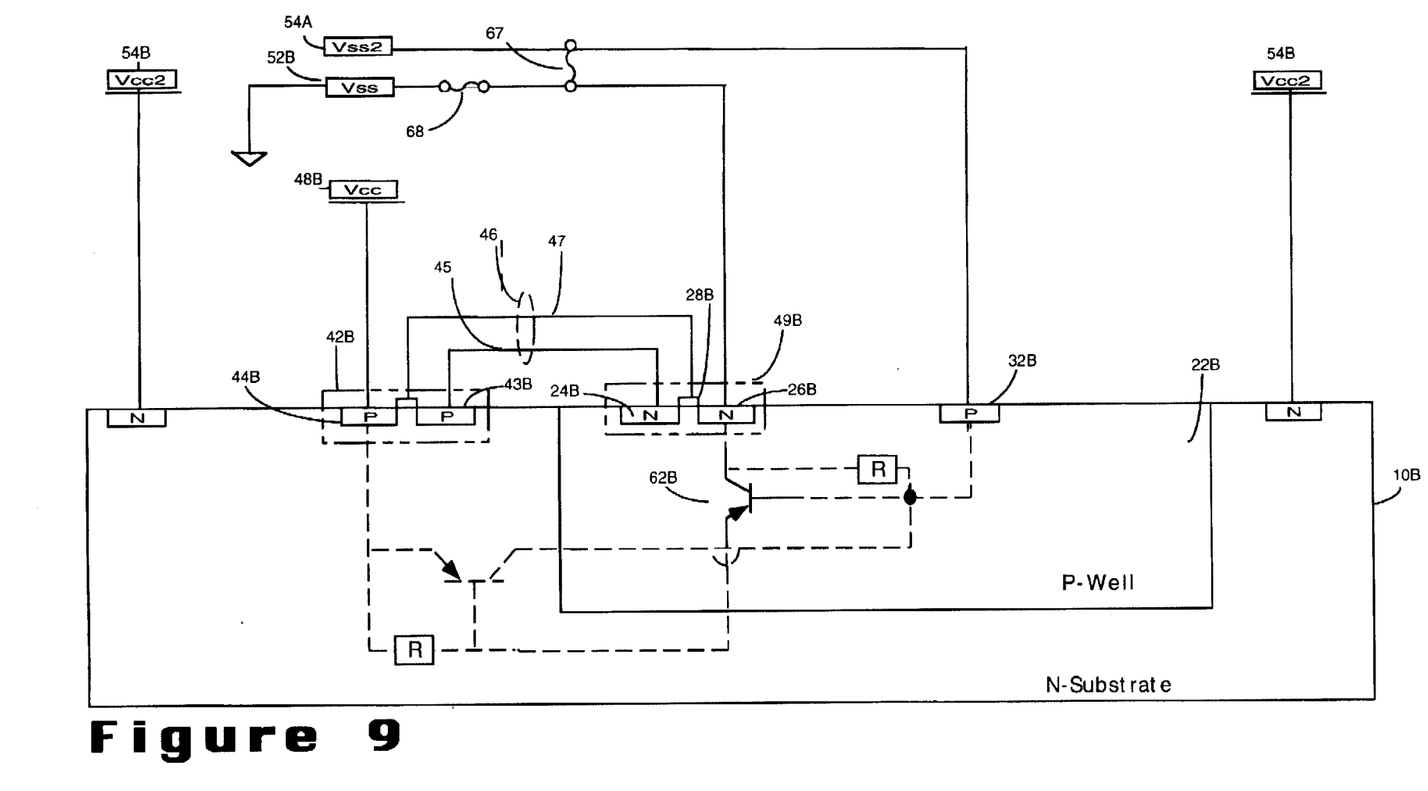
FIG. 9 is an inverter according to a third embodiment of the present invention, in which the conductivity types of silicon differs from the first embodiment shown in FIGS. 5 through 8.

FIG. 9 shows a third embodiment of the present invention in which the PMOS transistor has been replaced with an NMOS, and the NMOS transistor has been replaced with a PMOS transistor. As shown in FIG. 9, a switcheable pad may be connected to either the N-well in an N-well integrated circuit or the P-well in a P-well integrated circuit. As shown in FIG. 9, the present invention may also be implemented in dual well integrated circuits, with either one or both wells being connected to fusible pads. When multiple switcheable pads 54A and 54B are used, driving either or both to a rail voltage such that parasitic latch-up results causes the integrated circuit to be destroyed. As stated above, fusible link 67 may be omitted if separate power supplies are connected to the switcheable pads during normal operation, such that the switcheable pads may be driven to the opposite rail voltage when destruction is desired. It will be apparent that the addition of the second fusible link 68 in FIG. 9 is optional, as indicated above with reference to FIG. 5. It will also be apparent, as stated above with reference to FIGS. 6 and 8, that the second fusible link, when included, may appear anywhere in the operating current path of the circuit.

We claim:

1. A method of destroying a logic element in an integrated circuit, comprising the steps of:
   (a) forming a p-channel transistor disposed in a n-region of a semiconductor substrate, said p-channel transistor having a first terminal and a second terminal;
   (b) forming a n-channel transistor disposed in a p-region of said semiconductor substrate, said p-region being adjacent to said n-region;
   (c) coupling a first fusible link between said first terminal and said second terminal;
   (d) causing a first power supply having a first voltage to be coupled to said first terminal and a second power supply having a second voltage to be coupled to said second terminal, said first voltage being at a higher potential relative to said second voltage;
   (e) forward biasing a parasitic transistor developed between said first terminal and said n-region; and
   (f) causing a latchup current to flow through said p-channel transistor and destroying the logic element.

2. The method of claim 1 wherein prior to step (e), blowing said first fusible link.

3. The method of claim 2 wherein prior to step (d), including the step of coupling a second fusible link between said first terminal and said first power supply.

4. The method of claim 3 further including the step of blowing said second fusible link after destroying the logic element.

5. The method of claim 1 wherein said first terminal is coupled to a drain of said p-channel transistor and said second terminal is coupled to said n-region.

6. A method of destroying a logic element in an integrated circuit, comprising the steps of:
   (a) forming a n-channel transistor disposed in a p-region of a semiconductor substrate, said n-channel transistor having a first terminal and a second terminal;
   (b) forming a p-channel transistor disposed in a n-region of said semiconductor substrate, said n-region being adjacent to said p-region;
   (c) coupling a first fusible link between said first terminal and said second terminal;
   (d) causing a first power supply having a first voltage to be coupled to said first terminal and a second power supply having a second voltage to be coupled to said second terminal, said first voltage being at a lower potential relative to said second voltage;
   (e) forward biasing a parasitic transistor developed between said first terminal and said p-region; and
   (f) causing a latchup current to flow through said n-channel transistor and destroying the logic element.

7. The method of claim 6 wherein prior to step (e), including the step of blowing said first fusible link.

8. The method of claim 6 wherein prior to step (d), including the step of coupling a second fusible link between said first terminal and said first power supply.

9. The method of claim 8 further including the step of blowing said second fusible link after destroying the logic element.

10. The method of claim 6 wherein said first terminal is coupled to a drain of said n-channel transistor and said second terminal is coupled to said p-region.

11. A method of destroying a logic element in an integrated circuit, comprising the steps of:
   (a) forming a p-channel transistor disposed in a n-region of a semiconductor substrate, said p-channel transistor having a first terminal and a second terminal;
   (b) forming a n-channel transistor disposed in a p-region of said semiconductor substrate, said p-region being adjacent to said n-region;
   (c) coupling a first fusible link between said first terminal and said second terminal;
   (d) applying a first power supply having a first voltage to said first terminal;
   (e) adjusting a second voltage on said second terminal to a potential that is lower relative to said first voltage;
   (f) forward biasing a parasitic transistor developed between said first terminal and said n-region; and
   (g) causing a latchup current to flow through said p-channel transistor and destroying the logic element.

12. The method of claim 11 wherein prior to step (f), including the step of blowing said first fusible link.

13. The method of claim 11 wherein prior to step (d), including the step of coupling a second fusible link between said first terminal and said first power supply.

14. The method of claim 13 further including the step of blowing said second fusible link after blowing the logic element.

15. The method of claim 11 wherein said first terminal is coupled to a drain of said p-channel transistor and said second terminal is coupled to said n-region.

* * * * *